United States Patent
Rohr

(10) Patent No.: US 8,701,746 B2
(45) Date of Patent: Apr. 22, 2014

(54) OPTICALLY DETECTED LIQUID DEPTH INFORMATION IN A CLIMATE CONTROL UNIT

(75) Inventor: Daniel J. Rohr, Wildwood, MO (US)

(73) Assignee: Schneider Electric IT Corporation, West Kingston, RI (US)

(*) Notice: Subject to any disclaimer, the term of this patent is extended or adjusted under 35 U.S.C. 154(b) by 1410 days.

(21) Appl. No.: 12/047,967

(22) Filed: Mar. 13, 2008

(65) Prior Publication Data

US 2009/0229784 A1 Sep. 17, 2009

(51) Int. Cl.
*G01F 23/28* (2006.01)
*G01F 23/292* (2006.01)

(52) U.S. Cl.
USPC ............ 165/11.1; 165/301; 165/302; 73/293; 250/564; 250/573; 250/574; 250/575; 250/577; 62/285; 62/289; 62/291; 340/619

(58) Field of Classification Search
USPC ............ 250/573, 564, 574, 577, 575; 73/293; 62/285, 289, 291; 165/301, 302, 11.1; 340/619
See application file for complete search history.

(56) References Cited

U.S. PATENT DOCUMENTS

| | | | |
|---|---|---|---|
| 2,455,022 A | 11/1948 | Schmidt | |
| 3,548,657 A * | 12/1970 | Panerai et al. | 73/293 |
| 3,559,728 A | 2/1971 | Lyman | |
| 4,127,008 A | 11/1978 | Tyree, Jr. | |
| 4,197,716 A | 4/1980 | Nussbaum | |
| 4,285,205 A | 8/1981 | Martin et al. | |
| 4,515,746 A | 5/1985 | Brun et al. | |
| 4,535,598 A | 8/1985 | Mount | |
| 4,578,959 A * | 4/1986 | Alsenz | 62/140 |
| 4,590,538 A | 5/1986 | Cray, Jr. | |
| 4,696,168 A | 9/1987 | Woods et al. | |
| 4,774,631 A | 9/1988 | Okuyama et al. | |
| 4,827,733 A | 5/1989 | Dinh | |
| 4,837,663 A | 6/1989 | Zushi et al. | |
| 4,911,231 A | 3/1990 | Horne et al. | |

(Continued)

FOREIGN PATENT DOCUMENTS

EP 1610077 A2 12/2005
JP 58179319 A * 10/1983

(Continued)

OTHER PUBLICATIONS

Peter Röjsel and Werner Stiefler, MAX-lab, University of Lund, Box 118, S-221 00, Lund, Sweden, Hydrostatic Levelling System with Laser Sensors.

(Continued)

*Primary Examiner* — John Ford
(74) *Attorney, Agent, or Firm* — Lando & Anastasi, LLP

(57) ABSTRACT

Systems and methods for determining liquid depth information in a condensate pan of a climate control unit are provided. The systems and methods radiate a light beam into a liquid contained in a condensate pan associated with a climate control unit. The light beam is detected at a point of the condensate pan that is below a surface of the liquid. Information related to the depth of the liquid is determined based at least in part on the detected light beam. The systems and methods disclosed herein can determine if liquid depth in a condensate pan is greater than a threshold depth and can control evacuation of the liquid from the condensate pan.

13 Claims, 7 Drawing Sheets

(56) References Cited

U.S. PATENT DOCUMENTS

| | | |
|---|---|---|
| 4,981,039 A | 1/1991 | Hayashi et al. |
| 4,988,308 A | 1/1991 | Toedtman |
| 5,057,968 A | 10/1991 | Morrison |
| 5,090,207 A | 2/1992 | Gilbertson et al. |
| 5,095,712 A | 3/1992 | Narreau |
| 5,150,580 A | 9/1992 | Hyde |
| 5,158,132 A | 10/1992 | Guillemot |
| 5,173,819 A | 12/1992 | Takahashi et al. |
| 5,177,666 A | 1/1993 | Bland et al. |
| 5,323,847 A | 6/1994 | Koizumi et al. |
| 5,457,965 A | 10/1995 | Blair et al. |
| 5,533,357 A | 7/1996 | Voorhis |
| 5,555,747 A | 9/1996 | Conlon |
| 5,649,428 A | 7/1997 | Calton et al. |
| 5,657,641 A | 8/1997 | Cunningham et al. |
| 5,723,870 A | 3/1998 | Crowne et al. |
| 5,752,390 A | 5/1998 | Hyde |
| 5,802,860 A | 9/1998 | Barrows |
| 5,860,280 A | 1/1999 | Recine, Sr. et al. |
| 5,865,871 A | 2/1999 | Simundich |
| 5,970,729 A | 10/1999 | Yamamoto et al. |
| 5,972,196 A | 10/1999 | Murphy et al. |
| 5,984,144 A | 11/1999 | Wyatt |
| 6,023,935 A | 2/2000 | Okazaki et al. |
| 6,032,472 A | 3/2000 | Heinrichs et al. |
| 6,213,194 B1 | 4/2001 | Chrysler et al. |
| 6,269,695 B1 | 8/2001 | Cesternino et al. |
| 6,305,180 B1 | 10/2001 | Miller et al. |
| 6,334,331 B1 | 1/2002 | Chen et al. |
| 6,408,692 B1 | 6/2002 | Glahn |
| 6,446,505 B1 | 9/2002 | Wieszt et al. |
| 6,459,579 B1 | 10/2002 | Farmer et al. |
| 6,474,087 B1 | 11/2002 | Lifson |
| 6,494,050 B2 | 12/2002 | Spinazzola et al. |
| 6,508,068 B2 | 1/2003 | Ohkawara |
| 6,637,219 B2 | 10/2003 | Leisenheimer et al. |
| 6,662,576 B1 | 12/2003 | Bai |
| 6,668,565 B1 | 12/2003 | Johnson et al. |
| 6,695,577 B1 | 2/2004 | Susek |
| 6,715,304 B1 | 4/2004 | Wycoff |
| 6,718,781 B2 | 4/2004 | Freund et al. |
| 6,745,590 B1 | 6/2004 | Johnson et al. |
| 6,775,137 B2 | 8/2004 | Chu et al. |
| 6,819,563 B1 | 11/2004 | Chu et al. |
| 6,832,504 B1 | 12/2004 | Birkmann |
| 6,848,989 B2 | 2/2005 | Miyazaki et al. |
| 6,859,366 B2 | 2/2005 | Fink |
| 6,862,179 B2 | 3/2005 | Beitelmal et al. |
| 6,880,349 B2 | 4/2005 | Johnson et al. |
| 6,927,980 B2 | 8/2005 | Fukuda et al. |
| 6,955,058 B2 | 10/2005 | Taras et al. |
| 6,967,283 B2 | 11/2005 | Rasmussen et al. |
| 6,973,797 B2 | 12/2005 | Nemit, Jr. |
| 6,980,433 B2 | 12/2005 | Fink |
| 6,992,757 B2 * | 1/2006 | Holcomb et al. ............. 73/293 |
| 7,033,267 B2 | 4/2006 | Rasmussen |
| 7,046,514 B2 | 5/2006 | Fink et al. |
| 7,051,802 B2 | 5/2006 | Baer |
| 7,065,600 B2 | 6/2006 | Papa et al. |
| 7,106,590 B2 | 9/2006 | Chu et al. |
| 7,112,131 B2 | 9/2006 | Rasmussen et al. |
| 7,120,021 B2 | 10/2006 | Hamman |
| 7,140,193 B2 | 11/2006 | Johnson et al. |
| 7,145,772 B2 | 12/2006 | Fink |
| 7,148,796 B2 | 12/2006 | Joy et al. |
| 7,165,412 B1 | 1/2007 | Bean, Jr. |
| 7,173,820 B2 | 2/2007 | Fink et al. |
| 7,187,549 B2 | 3/2007 | Teneketges et al. |
| 7,228,707 B2 | 6/2007 | Lifson et al. |
| 7,236,363 B2 | 6/2007 | Belady |
| 7,278,273 B1 | 10/2007 | Whitted et al. |
| 7,292,898 B2 | 11/2007 | Clark et al. |
| 7,319,594 B2 | 1/2008 | Nicolai et al. |
| 7,360,529 B2 | 4/2008 | Ziegler et al. |
| 7,365,973 B2 | 4/2008 | Rasmussen et al. |
| 7,595,497 B2 * | 9/2009 | Albertson .................. 250/573 |
| 2001/0029747 A1 | 10/2001 | Gaul |
| 2001/0042616 A1 | 11/2001 | Baer |
| 2002/0076599 A1 | 6/2002 | Neutzler et al. |
| 2003/0042004 A1 | 3/2003 | Novotny et al. |
| 2003/0184975 A1 | 10/2003 | Steinman et al. |
| 2004/0099747 A1 | 5/2004 | Johnson et al. |
| 2004/0100770 A1 | 5/2004 | Chu et al. |
| 2004/0120855 A1 | 6/2004 | Reichel et al. |
| 2004/0190247 A1 | 9/2004 | Chu et al. |
| 2005/0061013 A1 | 3/2005 | Bond |
| 2005/0151764 A1 | 7/2005 | Grady et al. |
| 2005/0170770 A1 | 8/2005 | Johnson et al. |
| 2005/0225936 A1 | 10/2005 | Day |
| 2005/0235671 A1 | 10/2005 | Belady et al. |
| 2005/0237715 A1 | 10/2005 | Staben et al. |
| 2005/0237716 A1 | 10/2005 | Chu et al. |
| 2006/0082263 A1 | 4/2006 | Rimler et al. |
| 2006/0102575 A1 | 5/2006 | Mattlin et al. |
| 2006/0126296 A1 | 6/2006 | Campbell et al. |
| 2006/0139877 A1 | 6/2006 | Germagian et al. |
| 2006/0144073 A1 | 7/2006 | Lee et al. |
| 2006/0162357 A1 | 7/2006 | Fink et al. |
| 2006/0232945 A1 | 10/2006 | Chu et al. |
| 2006/0260338 A1 | 11/2006 | VanGilder et al. |
| 2006/0276121 A1 | 12/2006 | Rasmussen |
| 2007/0038414 A1 | 2/2007 | Rasmussen et al. |
| 2007/0072536 A1 | 3/2007 | Johnson et al. |
| 2007/0074537 A1 | 4/2007 | Bean et al. |
| 2007/0076373 A1 | 4/2007 | Fink |
| 2007/0078635 A1 | 4/2007 | Rasmussen et al. |
| 2007/0085678 A1 | 4/2007 | Joy et al. |
| 2007/0145309 A1 | 6/2007 | Zhang |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2007/0174024 A1 | 7/2007 | Rasmussen et al. |
| 2007/0213000 A1 | 9/2007 | Day |
| 2008/0041076 A1 | 2/2008 | Tutunoglu et al. |
| 2008/0041077 A1 | 2/2008 | Tutunoglu |
| 2008/0105412 A1 | 5/2008 | Carlsen et al. |
| 2008/0141703 A1 | 6/2008 | Bean, Jr. |
| 2008/0142068 A1 | 6/2008 | Bean et al. |
| 2008/0198549 A1 | 8/2008 | Rasmussen et al. |
| 2008/0202599 A1 | 8/2008 | Ziegler et al. |
| 2008/0245083 A1 | 10/2008 | Tutunoglu et al. |

FOREIGN PATENT DOCUMENTS

| | | | |
|---|---|---|---|
| JP | 62140029 A | * | 6/1987 |
| JP | 03249522 A | * | 11/1991 |
| JP | 2001-260640 A | | 9/2001 |

OTHER PUBLICATIONS

"Essential Cooling System Requirements for Next Generation Data Centers," White Paper #5, Revision 3, 2003 American Power Conversion, Rev 2002-3, pp. 1-10.

Neil Rasmussen, "Avoidable Mistakes that Compromise Cooling Performance in Data Centers and Network Rooms," White Paper #49, 2003 American Power Conversion, Rev 2003-0, pp. 1-15.

Neil Rasmussen, "Cooling Options for Rack Equipment with Side-to-Side Airflow," White Paper #50, 2004 American Power Conversion, Rev 2004-0, pp. 1-14.

Neil Rasmussen, "Air Distribution Architecture Options for Mission Critical Facilities," White Paper #55, Revision 1, 2003 American Power Conversion, Rev 2003-0, pp. 1-13.

"How and Why Mission-Critical Cooling Systems Differ from Common Air Conditions," White Paper #56, Revision 2, 2003 American Power Conversion, Rev 2003-2, pp. 1-13.

Tony Evans, "Fundamental Principles of Air Conditioners for Information Technology," White Paper #57, Revision 1, 2004 American Power Conversion, Rev 2004-1, pp. 1-9.

(56) References Cited

OTHER PUBLICATIONS

Tony Evans, "Humidification Strategies for Data Centers and Network Rooms," White Paper 58, 2004 American Power Conversion, Rev 2004-0, pp. 1-13.

Tony Evans, "The Different Types of Air Conditioning Equipment for IT Environments," White Paper #59, 2004 American Power Conversion, Rev 2004-0, pp. 1-21.

Neil Rasmussen, "Guidelines for Specification of Data Center Power Density," White Paper #120, 2005 American Power Conversion, Rev 2005-0, pp. 1-21.

International Search Report for PCT/US07/01109 mailed Mar. 28, 2008.

International Search Report for PCT/US2006/037772 mailed Jul. 10, 2007.

* cited by examiner

OPTICALLY DETECTED LIQUID DEPTH INFORMATION IN A CLIMATE CONTROL UNIT

BACKGROUND OF THE INVENTION

1. Field of the Invention

At least one embodiment of the present invention relates generally to detection of fluid levels, and more specifically, to optical determination of information related to a liquid depth in a condensation pan of heating, ventilating, and air conditioning devices.

2. Discussion of the Related Art

Heating, ventilating, and air conditioning (HVAC) devices are used for a variety of climate control applications to regulate temperature or humidity levels of an environment such as a room. When performing a cooling operation, condensation forms on cooling or evaporation coils of the air conditioning unit as latent heat is extracted from the environment. This condensation gathers as a pool of water beneath the air conditioning evaporation coils. This water can be collected in a container but eventually must be removed to prevent overflow or leakage. Unintended water flow or stagnation can damage the HVAC device or its surroundings.

Existing schemes for controlling water flow and placement due to condensation during HVAC operation utilize mechanical devices such as float switches; capacitive switches; sensors detecting conduction or pressure changes; weighing a container in which water has collected; or tracking volumetric loads delivered to the container. However, these types of HVAC water control and displacement systems are not without their drawbacks, as these control systems have mechanical size and space constraints and are prone to corrosion, inaccurate, difficult to monitor, and susceptible to long term degradation.

SUMMARY OF THE INVENTION

Systems and methods disclosed herein monitor and control liquid collection and displacement in climate control units. To increase efficiency, increases or decreases of liquid depth in a condensate pan over time can be monitored. Further, information related to liquid depth can be independently determined at several points within a condensate pan to detect tilt or variances in liquid displacement due to unevenly shaped condensate pans or installation imperfections. This improves reliability and reduces cost. At least one aspect of the invention is directed to a method of determining information related to liquid depth in a condensate pan of a climate control unit. The climate control unit is associated with a condensate pan. A light beam is radiated into the condensate pan towards a first point that is below a surface of liquid that is collected in the condensate pan, and the light beam is detected at a second point that is below the surface of the liquid. Information related to a depth of the liquid is determined based at least in part on the detected light beam.

At least one other aspect of the invention is directed to a cooling unit. The cooling unit includes a cooling device and a condensate pan, configured to collect liquid and associated with the cooling device. A generator is configured to propagate a light beam into the condensate pan, and the light beam is configured to pass through a surface of a liquid collected in the condensate pan. A detector is associated with the condensate pan at a point configured to be below the surface of the liquid and configured to detect the light beam. A controller associated with the cooling unit determines information related to a depth of the liquid based at least in part on the sensed light beam.

At least one other aspect of the invention is directed to a cooling unit. The cooling unit is associated with a condensate pan formed to collect liquid. A generator is adapted to direct a light beam into the condensate pan. A detector associated with the condensate pan is adapted for submersion below the surface of a liquid collected in the condensate pan and is adapted to sense the light beam. The cooling unit includes means for determining information related to a depth of the liquid based at least in part on the detector sensing the light beam.

Various embodiments of these aspects may include determining and providing an indication that liquid depth in the condensate pan is greater than a threshold depth. At least one embodiment may include pumping or draining liquids from the condensate pan. The light beam may include a laser beam, and may be radiated at a predetermined angle with respect to the surface of the liquid. In some embodiments the light beam can be detected by any of a plurality of detectors, and the plurality of detectors can be in one or more rows, where each row is coplanar with the light beam. One or more detectors may detect one or more light beams at a plurality of points below the surface of the liquid, and information related to the depth of the liquid can be determined at more than one point. In one embodiment the cooling unit shuts down based at least in part on information related to the depth of the liquid. In various embodiments a change in liquid depth with time can be identified. Furthermore, in an embodiment radiating the light beam, detecting the light beam, and determining information related to the depth of the liquid are controlled by a processor and implemented in part in a program stored in a computer readable medium and executed by the processor.

Other aspects and advantages of the systems and methods disclosed herein will become apparent from the following detailed description, taken in conjunction with the accompanying drawings, illustrating the principles of the invention by way of example only.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
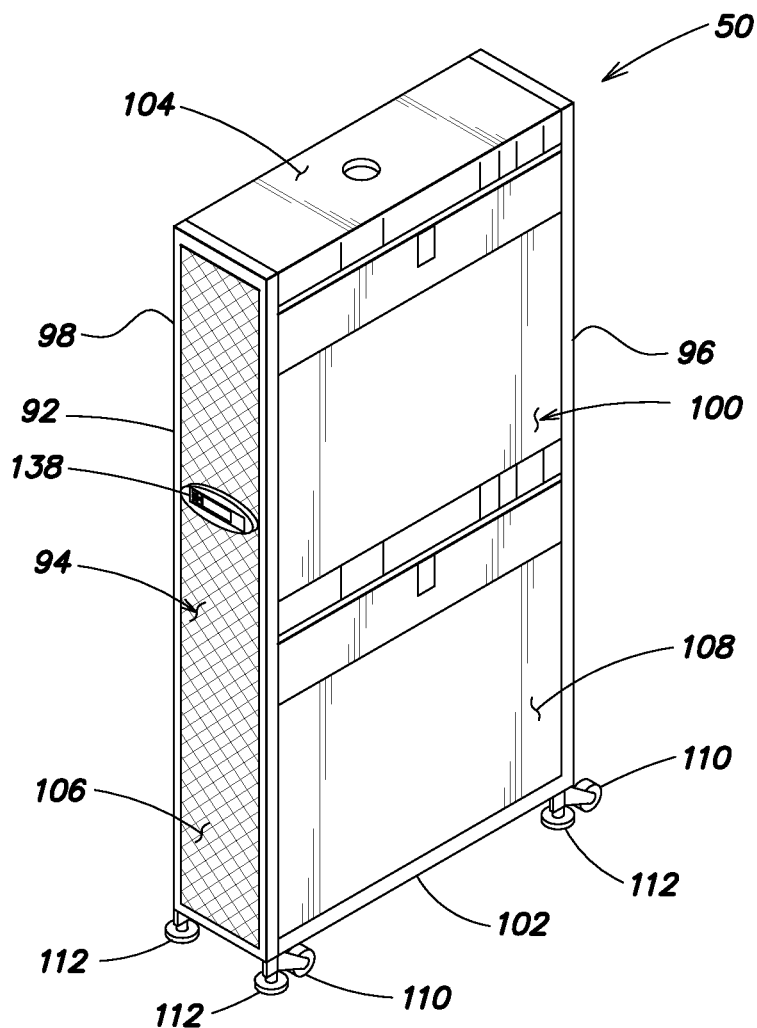
FIG. 1 is a perspective view of a cooling rack in accordance with an embodiment of the invention.

The systems and methods described herein are not limited in their application to the details of construction and the arrangement of components set forth in the description or illustrated in the drawings. The invention is capable of other embodiments and of being practiced or of being carried out in various ways. Also, the phraseology and terminology used herein is for the purpose of description and should not be regarded as limiting. The use of "including" "comprising" "having" "containing" "involving," or variations thereof herein, is meant to encompass the items listed thereafter and equivalents thereof as well as additional items.

Climate control units, including cooling units and dehumidifiers, are typically present in rooms such as data centers to regulate atmospheric conditions therein. A climate control unit generally comprises a cooling unit including a housing having a front, a back, two sides, a bottom and a top. In one embodiment cooling units can regulate the temperature and humidity levels in and around equipment enclosures or racks for housing electronic equipment, such as data processing, networking, or telecommunications equipment. An exemplary industry standard equipment rack, commonly referred to as a "nineteen inch rack" includes a rack having components with a width of approximately 19 inches, and where the rack occupies approximately 24 by 48 inches of floor space, as defined by the Electronics Industries Association's EIA-310-D standard. In one embodiment the housing of the cooling unit can have a width of approximately one-half the width of an equipment rack. For example, a cooling unit can be constructed and arranged to be positioned next to an equipment rack in such a manner that a side of the cooling unit is adjacent to a side of the equipment rack and that the fronts and the backs of the equipment rack and the cooling unit lay along substantially same planes. In one embodiment the cooling unit may be disposed within a row of equipment racks. In various other embodiments, however, the dimensions of a cooling unit can vary widely, and cooling units generally are not restricted by their size or their use in data centers.

The cooling unit of a climate control unit generally includes cooling coils, and during operation water can collect on cooling coils of the climate control unit, for example in situations where the temperature of the cooling coil is below the dew point. Excess water collected on the cooling coils often drips or flows into a condensate pan. If, for example, water overflows the condensate pan it can damage the cooling unit, any nearby electrical equipment, or the room in which the cooling unit is located.

Turning now to the drawings, and more particularly to FIG. 1, there is shown a perspective view of an embodiment of cooling unit 50. Cooling unit 50 in this illustrative embodiment includes a housing 92. In an embodiment with cooling unit 50 included in a data center, housing 92 can be constructed similarly to the housing of any equipment racks that are also located in the data center. For example, housing 92 can be of a generally rectangular shape including front 94, back 96, two sides 98, 100, bottom 102 and top 104 defined by a frame constructed of vertical and horizontal support members. In one embodiment, cooling unit 50 can be configured to accommodate cooling equipment and may be conveniently broken down and disassembled for transport or storage with the aid of hand tools only.

In one embodiment, front 94 of housing 92 of cooling unit 50 includes front panel 106 suitably secured to the frame. In an illustrative embodiment where cooling unit 50 is located in a data center, front panel 106 generally enables an operator of the data center to access the interior region of the cooling unit 50. The cooling unit 50 may include side panels attachable to the frame of the housing 92 to cover the sides 98, 100, and 108 of the cooling unit. Housing 92 may further include a back panel (not shown in FIG. 1) to cover back 96 of cooling unit 50. In one embodiment, the front, side and back panels may be suitably secured, e.g., by suitable screw fasteners, to the frame of the cooling unit 50. In another embodiment, fasteners capable of manipulation by hand, e.g., thumb screws or quarter-turn fasteners, may be employed to attach the panels to the frame.

In one embodiment at least one condensate pan, (not shown in FIG. 1) may be included inside cooling unit 50. For example, a condensate pan may be positioned between side 98 and side 100, and above bottom 102. In another embodiment a condensate pan may be positioned below bottom 102, and between leveling feet 112 or casters 110, which generally enable rolling of cooling unit 50 along a roughly horizontal surface. With respect to cooling unit 50, reference is made to U.S. patent application Ser. No. 11/335,874, entitled "COOLING SYSTEM AND METHOD," filed on Jan. 19, 2006, which is assigned to the assignee of the present application and incorporated herein by reference in its entirety. The referenced application generally discloses systems and methods for cooling data center equipment.

Figure 2:
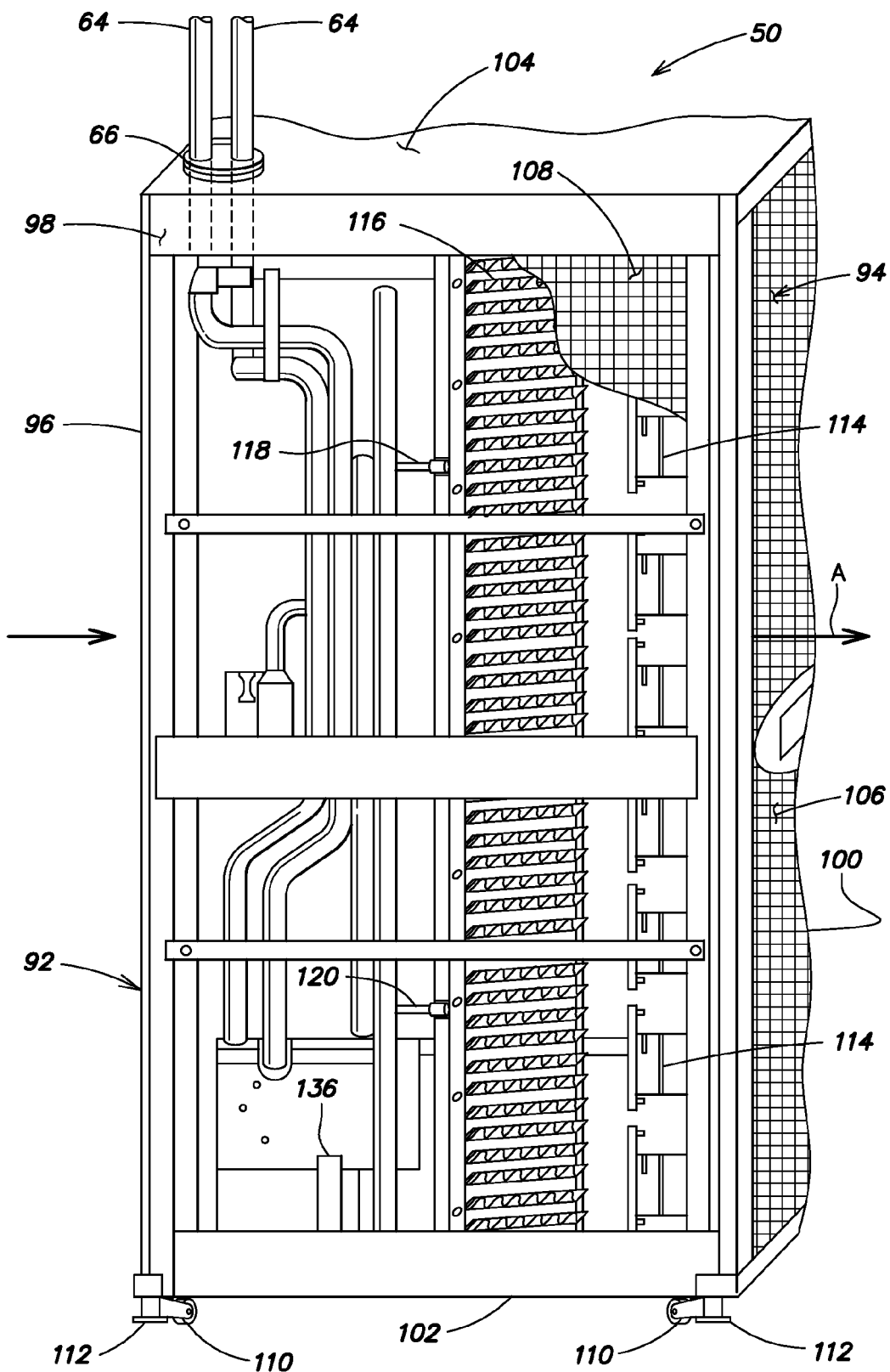
FIG. 2 is a side cut-away view of a cooling unit in accordance with an embodiment of the invention.

FIG. 2 is a side cut-away view of an embodiment of cooling unit 50 with a portion of a side panel removed to show the interior of cooling unit 50 and associated elements, which can include variable speed fans 114. Cooling unit 50 may also include flexible tubing 64 and coupling 66, which may operate in conjunction with a distribution box (not shown) to regulate coolant flow through flexible tubing 64 and cooling unit 50. For example, chilled coolant may be provided to heat exchanger 116 by travelling through flexible tubing 64 and lines 118, 120. As shown in FIG. 2, housing 92 of cooling unit 50 creates a space within the interior region of the cooling unit to allow components of a cooling system to be housed within the cooling unit. In at least one embodiment, one or more generators (not shown in FIG. 2) configured to propagate a light beam such as a laser can be located within housing 92 of cooling unit 50. These generators can, for example, be fixed or mounted to housing 92 or its associated components and configured to propagate at least one light beam into one or more condensate pans (not shown in FIG. 2) that can also be located within housing 92. In one embodiment at least one condensate pan can be located underneath coils associated with heat exchanger 116, and pump 136 may activate to evacuate water from this condensate pan. In certain embodiments, front panel 106 may embody a door hingedly attached to the frame of housing 92.

In one embodiment cooling unit 50 can be modular in construction and configured to be moved into and out of a position. For example, cooling unit 50 can be positioned between two equipment racks in a data center, or in various other configurations within a row of equipment racks in a data center or other area. Cooling unit 50 need not be associated with equipment racks or data centers, and in various embodiments may be part of a climate control unit for any enclosed area, such as a room of a private residence, for example. In one embodiment a plurality of casters 110 can be secured to the bottom of housing 92. Casters 110 generally impart mobility to cooling unit 50, for example to enable cooling unit 50 to roll along the floor of a data center or other room. When cooling unit 50 is in a desired position, a plurality of leveling feet 112 may be deployed to securely ground cooling unit 50 in place. In one embodiment, housing 92 of cooling unit 50 can be formed with an eye-bolt to enable a crane or some other lifting apparatus to raise and place cooling unit 50 in a particular location, such as a data center or a particular location of an industrial complex.

In one embodiment housing 92 of cooling unit 50 can be one-half the width of an industry standard equipment rack, e.g., approximately 12 inches in width, cooling unit 50 may be sized to any desired configuration. The provision of cooling unit 50 having one-half the industry-standard width improves the scalability of cooling unit 50. However, it is contemplated, for example, to configure housing 92 to have the same width as a housing of an equipment rack, (e.g., a full width of approximately 24 inches.) In such an embodiment, cooling unit 50 may be configured with cooling system components that enhance cooling capacity. This configuration can be desirable, for example, in hot spots within a data center. It should be appreciated, however, that in various embodiments the dimension of cooling unit 50 can vary widely, and cooling unit 50 is not restricted in size, form, or function to cooling units that operate in data centers. Any standard or custom HVAC unit typically includes at least one cooling unit 50.

Figure 3:
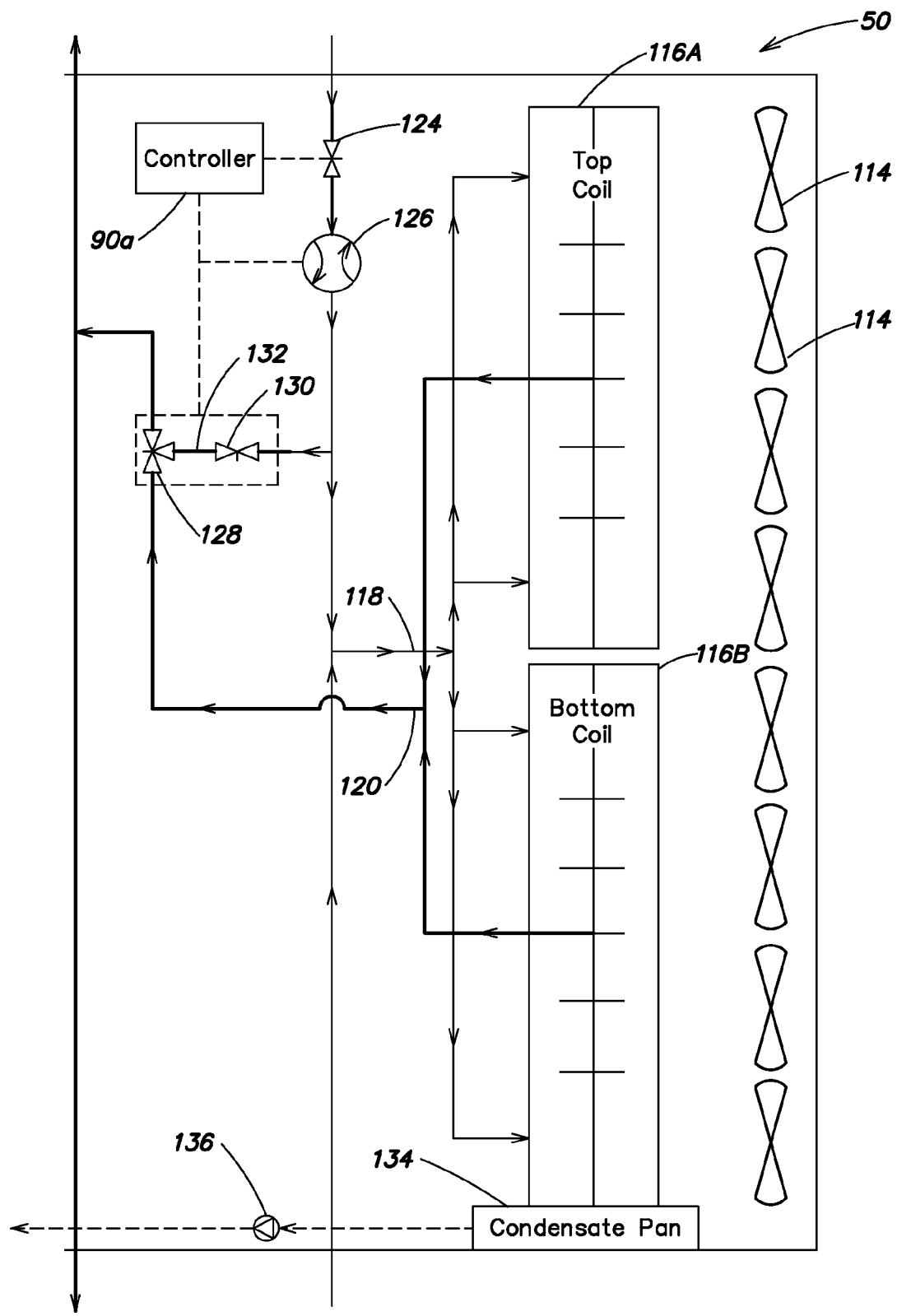
FIG. 3 is a schematic representation of a cooling unit in accordance with an embodiment of the invention.

FIG. 3 includes a schematic representation of cooling unit 50. In one embodiment, chilled coolant may enter cooling rack 50 and flow through two way valve 124 and flow meter 126, which may be provided to control delivery of chilled coolant into the cooling rack. Continuing with this illustrative embodiment, once heated, coolant can be delivered from heat exchanger 116 to a return feed via line 120 to three-way mixing valve 128. For example, a portion of chilled coolant may be diverted from line 118 to three way mixing valve 128 by two-way, quarter turn, by pass, shut off ball valve 130. Ball valve 130 may be attached to bypass leg 132 of mixing valve 128 so that shutting off ball valve 130 may provide two-way control of a three-way valve.

In one embodiment, cooling unit 50 includes at least one condensate pan 134. Condensate pan 134, for example, may be provided at the bottom of cooling unit 50 to capture condensation from the top and bottom coils 116A, 116B of heat exchanger 116. Heat exchanger 116 may be housed within housing 92 of cooling unit 50. Cooling unit 50 is generally configured to draw warm air over heat exchanger 116 to cool the warm air which can cause condensation to develop on top and bottom coils 116A and 116B of heat exchanger 116.

Condensate pan 134 is generally a vessel that may be of any shape capable of retaining liquid. In one embodiment condensate pan 134 may be approximately 22 inches by 10 inches by 4 inches tall. In other embodiments condensate pan 134 dimensions can vary to include a variety of shapes capable of collecting liquid. Condensate pan 134 may be symmetrical or asymmetrical, and may be shaped so that the depth of a liquid collected in condensate pan 134 varies from one part of condensate pan 134 to another part of condensate pan 134 due, for example, to an uneven shape of condensate pan 134. In one embodiment condensate pan 134 can be positioned beneath either or both of coils 116A or 116B so that gravitational forces act on condensate collected on coils 116A or 116B to force condensed liquid thereon to collect in condensate pan 134. In another embodiment condensate pan 134 can be positioned so that it is not directly underneath heat exchanger 116 but that liquid condensing on coils 116A or 116B, or both, can flow over, on or through various elements such as pipes or guide panels to be directed into condensate pan 134. In one embodiment condensate pan 134 can be located external to cooling unit 50, and in various embodiments a single condensate pan 134 can be used to collect liquid simultaneously or in series from a plurality of cooling units 50, and cooling unit 50 may be associated with a plurality of condensate pans 134. A pump 136 may be provided to evacuate liquid from condensation pan 134. Although not shown, a drain may also be provided for the same evacuation purpose.

Figure 4:
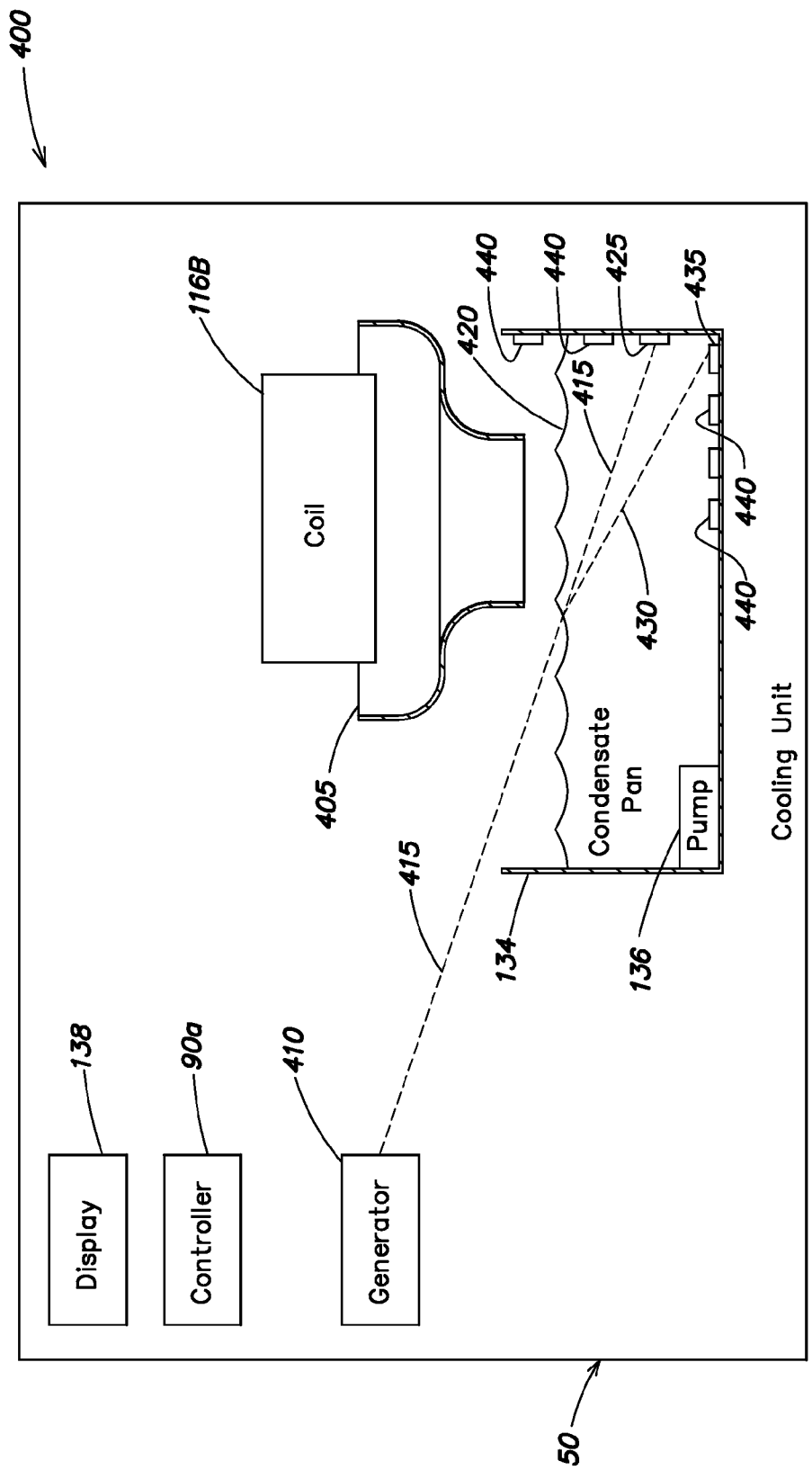
FIG. 4 is a functional block diagram of a system for detecting liquid depth in accordance with an embodiment of the invention.

FIG. 4 is a functional block diagram of a system 400 for detecting liquid depth in accordance with an embodiment of the invention. System 400 generally includes at least one cooling unit 50. Coil 116B of heat exchanger 116 of FIG. 3 generally is positioned so that liquid condensing on coil 116B eventually runs into condensate pan 134. In one embodiment, at least one guide panel 405 can direct the flow of liquid from condensing coil 116B into condensate pan 134. Guide panels 405 may be of various configurations, and may form a funnel shape at or below the bottom of coil 116B in order to control liquid flow between condensing coil 116B and condensate pan 134.

In one embodiment, system 400 includes at least one generator 410. Generator 410 is generally capable of generating and propagating a light beam, such as a laser light beam. Generator 410 may, but need not be, associated with cooling unit 50 inside housing 92. Generally, generator 410 is positioned so that it may propagate, radiate, or direct at least one light beam 415 into condensate pan 134. In one embodiment this propagation can be direct, for example when there is a clear line of sight between generator 410 and condensate pan 134. In another embodiment, this propagation can be indirect, for example in situations where one or more mirrors (not shown) reflect light beam 415 towards a destination in condensate pan 134. Similar use of mirrors can also enable generator 410 to be located externally to cooling unit 50 in various embodiments. Although generator 410 is illustrated as being external to condensate pan 134, in one embodiment generator 410 can be located in condensate pan 134, generally above a liquid surface 420. In one embodiment generator 410 can generate a plurality of light beams, where each light beam is propagated towards a different location in one or more condensate pans 134.

In an illustrative embodiment, generator 410 generates and propagates light beam 415 into condensate pan 134. For example, generator 410 can direct light beam 415 towards a first of a plurality of detectors 425. In this example and as illustrated, light beam 415 passes through liquid surface 420. Light beam 415 is generally refracted due to the change in medium, (from air to liquid) as it passes liquid surface 420. This refraction alters the path of light beam 415. In an embodiment where light beam 415 is directed into condensate pan 134 that contains liquid, refraction can cause light beam 420 to illuminate condensate pan 134 at a different location than it would otherwise have illuminated condensate pan 134 in the absence of any liquid. For example, generator 410 can generate light beam 415 and propagate light beam 415 towards a first point inside condensate pan 134 that includes first detector 425 so that in the absence of liquid in condensate pan 134, light beam 415 would strike first detector 425. Continuing with this example, when liquid is present in condensate pan 134, light beam 415 is refracted as it passes liquid surface 420. Refracted light beam 430 generally does not follow the path of light beam 415, and instead proceeds upon a refracted path until illuminating a second point inside condensate pan 134. In one embodiment this second point can be associated with a second detector 435. Second detector 435 is generally associated with a different location of condensate pan 134 that can be below liquid surface 420 when liquid is present in condensate pan 134.

Generator 410 can generate light beam 415 that passes liquid surface 420 at any of a plurality of angles with respect to liquid surface 420. This angle may vary between 0 and 90 degrees, and is also typically based on condensate pan 134 geometry and liquid depth capacity. In one embodiment, one or more generators 410 generate a plurality of light beams 415, each light beam 415 passing liquid surface 420 at a different angle. In one embodiment, light beam 415 passes liquid surface 420 at and angle that is between 40 and 50 degrees with respect to liquid surface 420.

Generally, the amount of refraction is indicative of liquid characteristics such as liquid depth, liquid type, or liquid contamination by debris, for example. In one embodiment, detection of refracted light beam 430 by second detector 435 can be sufficient to indicate that liquid depth in condensate pan 134 meets or exceeds a threshold value. In this example, a display such as display 138 can indicate that action should be taken to control or reduce liquid depth in condensate pan 134. In one embodiment, display 138 can include a monitor operably coupled to controller 90a to indicate information related to liquid depth based at least in part on detection of light beam 415 by first detector 425, detection of refracted light beam 430 by at least one second detector 435, or a combination thereof, for example. In other embodiments, other audible or visual indicators may be used in addition to or in place of display 138.

In one embodiment, controller 90a can direct pump 136 to evacuate liquid from condensate pan 134 to a safe location outside cooling unit 50. In one embodiment, second detector 435 may include a photodiode that can emit its own light when illuminated by refracted light beam 430 to provide a visual indication, from its location beneath liquid surface 420, that liquid depth has exceeded a threshold value and that action may be required. In one embodiment, second detector 435 can be associated with controller 90a such that when second detector 435 is illuminated by refracted light beam 430, a signal is sent to controller 90a. In this example controller 90a may activate pump 136, direct display 138 to display an indication of information related to liquid depth (such as an audio or visual alarm that a threshold depth value is met,) or a combination thereof. In one embodiment either of controller 90a or generator 410, with which controller 90a may be associated, can control a duty cycle of light beam 415. In another embodiment, illumination of a particular detector 425, 435, or 440 associated with a particular liquid depth by refracted light beam 430 can trigger operation of pump 136, and illumination of a subsequent detector 425, 435, or 440 associated with a deeper liquid depth can trigger or transmit an audio or visual alarm signal. This alarm signal may be displayed on display 138 or by light emissions of detectors 425, 435, or 440. In one embodiment, an alarm signal can be transmitted to a user or maintenance technician.

In one embodiment, controller 90a can include at least one processor or other logic device capable of data manipulation, such as a microprocessor chip capable of data processing. For example, controller 90a can include at least one processor that is at least part of a central processing unit of a computer. In another embodiment, controller 90a can include one or more receiving circuits or acting circuits that may, for example, perform at least in part logic operations.

In one embodiment, the absence of light beam 415 illumination upon first detector 425 can be sufficient to indicate a liquid depth meets a threshold level. This may occur, for example, when light beam 415 is refracted to a path defined by refracted light beam 430. This may also occur when a liquid in condensate pan is of a type, color, or viscosity that blocks or reflects the path of light beam 415 so that it does not illuminate first detector 425 when first detector 425 is submerged under liquid surface 420.

First detector 425, second detector 435, and a plurality of additional detectors 440 can typically each include any of at least one Positive Intrinsic Negative (PIN) diode, photodetector, photodiode, light sensor, photoresistor, phototransistor, photovoltaic detector, thermometer (e.g., pyroelectric detector,) optical detector, or other devices that sense light or electromagnetic energy. In one embodiment, each of first detector 425, second detector 435, and additional detectors 440 can be positioned within condensate pan 134 in a location capable of being submerged beneath liquid surface 420 when, for example, an amount of liquid has condensed on cooling coil 116B and been guided by guide panels 405 into condensate pan 134.

In one embodiment, first detector 425 includes a detector associated with a location of condensate pan 134 that light beam 415 illuminates if it is not refracted by liquid collected in condensate pan 134. For example, if condensate pan 134 is empty (i.e., dry) then light beam 415 generally illuminates first detector 425. Second detector 435 in one embodiment includes a detector associated with a location of condensate pan 134 beneath liquid surface 420 illuminated by refracted light beam 430. Due to the refraction, in one embodiment, where light beam 415 passes through liquid surface 420, light beam 415 does not illuminate, or illuminates with less intensity, first detector 425. In one embodiment, refracted light beam 430 can include light beam 415 redirected upon passage through liquid surface 420.

In various embodiments, all, part, or none of light beam 415 can be refracted into refracted light beam 430. For example, light beam 415 may pass through liquid surface 420 where a portion of light beam refracts, forming refracted light beam 430, but some of light beam 415 continues to propagate substantially in the direction in which it was propagated from generator 410 so that at least a portion of light beam 415 can be detected by first detector 425. In this illustrative embodiment, first detector 425 can detect light beam 415 and second detector 435 can detect refracted light beam 430. Continuing, in one embodiment a threshold value may be set so that any illumination of second detector 435 can signal that liquid depth has reached a point where action, such as liquid evacuation from condensate pan 134 should be taken. In another embodiment, the absence of illumination, or a weakening in the magnitude of illumination of first detector 425 by light beam 415 can trigger a determination of, for example, rising liquid depth in condensate pan 134.

In various embodiments information related to liquid depth can be tracked over time. For example, detectors 425, 435, or 440 can detect increases, decreases, or a steady state condition of liquid depth in condensate pan 134. In one embodiment any of detectors 425, 435, or 440 can themselves provide a display indicating information related to liquid depth. For example, detectors 425, 435, and 440 that include light emitting diodes acting as detectors emit their own light when illuminated by light beam 415 or refracted light beam 430 by alternating between emitter and detector modes of operation. Detectors 425, 435, and 440 that emit light in this manner may continue to emit light even after light beam 415 or refracted light beam 430 have moved to a new position with time, due for example to changes in refraction caused by increases or decreases in liquid depth.

By continuing to emit light, when detectors 425, 435, or 440 are organized in a known manner relative to condensate pan 134, such as in a row, the position of detectors 425, 435, or 440 illuminating light for a period of time during or after illumination by light beam 415 or refracted light beam 430 may indicate information such as the rate or magnitude of liquid depth change in condensate pan 134. For example, if liquid depth in condensate pan is increasing, the amount of light beam 415 refraction into refracted light beam 430 will increase, causing refracted light beam 430 to illuminate different second detectors 435, each associated with different locations of condensate pan 134. If the plurality of second detectors 435 that are illuminated by refracted light beam 430 in this example continue to emit their own light for a period of time, second detectors 435 can form a particular or recognizable illumination pattern on condensate pan 134. A user can be trained to recognize this illumination pattern as, in this example, an indication that liquid depth is increasing. In an alternative embodiment of this example, second detectors 435 may communicate with controller 90a to display on display 138 an indication that liquid depth is increasing. Controller 90a may, for example, proceed by activating pump 136 to evacuate liquid from condensate pan 134. In various embodiments analogous illumination patterns of second detectors 435 can indicate information such as an increase or decrease in liquid depth, and illumination of no detectors or of one detector such as first detector 425 or second detector 435 can indicate information such as no change in liquid depth over a finite time period.

It should be appreciated that as liquid depth fluctuates with changes in the volume of liquid entering and exiting condensate pan 134, any detector 425, 435, or 440 can be located at, above, or below, liquid surface 420, and that each of these detectors may detect light beam 415 regardless of their position above or below liquid surface 430. In one embodiment, any of detectors 425, 435, or 440 can be fixed to an interior surface of condensate pan 134. In another embodiment, detectors 425, 435, or 440 can be integrated into surface of condensate pan 134 so that they are flush with an interior surface of condensate pan. In still another embodiment, any of detectors 425, 435, or 440 can be positioned external to condensate pan 134 such that they can still receive an indication that any light beam such as light beam 415 or refracted light beam 430 has illuminated an area of condensate pan 134. In one example of this embodiment, condensate pan 134 may include translucent surfaces such that light beam 415 or refracted light beam 430 passes through condensate pan 134 to illuminate detector 425, 435, or 440 that is located external to condensate pan 134. In one embodiment, any of detectors 425, 435, or 440 can be associated with locations on the bottom or any lateral walls of condensate pan 134 that are capable of being submerged by the liquid and that are capable of being illuminated, directly or indirectly, by light beam 415 or refracted light beam 430.

It should also be generally appreciated that a power savings can be affected by detecting light beam 415 or refracted light beam 430 below liquid surface 420 as opposed to detecting a light beam that has emerged from a liquid after travelling through the liquid and reflecting back out of the liquid. Generally, in this latter instance a stronger light beam would be required as it would need to travel farther through the liquid medium, (i.e., down through the liquid to the bottom of a vessel and then back up to the surface again.)

Although FIG. 4 illustrates an embodiment where a single generator 410 is shown to propagate a single light beam 415, it should be understood that in various embodiments a plurality of generators may be provided, and each of these generators can propagate a plurality of light beams 415 into condensate pan 134 at a plurality of angles with respect to liquid surface 420. Generally each light beam 415 may be refracted into at least one refracted light beam 430 when passing through liquid surface 420 and each light beam may be detected by any detector 425, 435, or 440.

Generally generator 410 combined with a plurality of detectors 425, 435, and 440 associated with condensate pan 134 of cooling unit 50 can be used to establish a condensate production rate. Given that the volume change is constant from, for example the illumination of one second detector 435 to the illumination of another second detector 435, and using the time variable between these two events, a condensate production rate may be established. The cooling capacity of cooling unit 50 may be rated based on two factors: (1) the temperature change in the air (sensible capacity), and (2) the humidity change in the air (latent capacity). The liquid present in condensate pan 134 is a measure of how much water vapor is removed from the air, therefore, by knowing the condensate production rate, the latent capacity of the unit may be established. In one embodiment illumination of any particular detector 425, 435, or 440 may correspond to a liquid depth of a known amount. Because condensation pan 134 is generally of known or measurable dimensions, a volume of liquid collected in condensate pan 134 may also be calculated. Cooling unit 50 generally requires some power to operate and condense liquid such as water out of the surrounding atmosphere. The amount or volume of this water taken out of the atmosphere by the operation of cooling unit 50 can be used to determine power requirements of cooling unit 50, thus improving the efficiency of cooling unit 50 or, for example, a data center in which cooling unit 50 is located.

Additionally, detectors 425, 435, or 440 may, either directly or via controller 90a, direct the operation of pump 136. For example, illumination of a particular second detector 435 may initiate pump 136 operation and the illumination of another first detector 425 or second detector 435 may terminate pump 136 operation. In various embodiments, initiation or termination of pump 136 operation may include communication between controller 90a and any detector 425, 435, or 440. In another embodiment, display 138 may indicate the status of pump 136, as well as information related to liquid depth, such as increases or decreased in depth, or how many second detectors 435 have been illuminated in a particular time period. In one embodiment, with the exception of pump 136, cooling unit 50 utilizes direct current components. In another embodiment, pump 136 may include direct current components.

Figure 5:
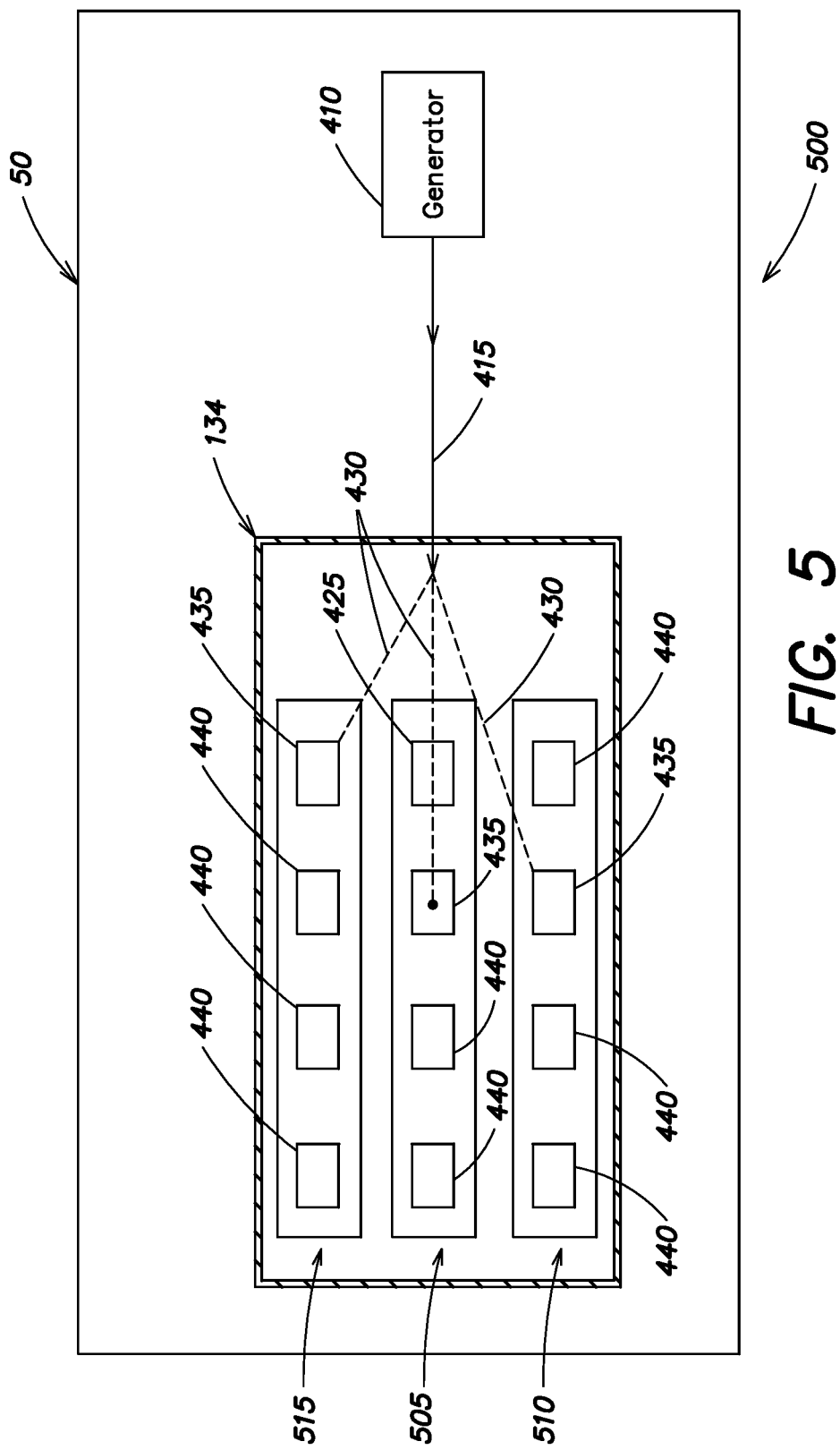
FIG. 5 is a top view of a system for detecting liquid depth in accordance with an embodiment of the invention.

FIG. 5 is a top view of a system 500 for detecting liquid depth looking down from the perspective of coil 116B (not shown) into condensate pan 134. In this illustrative embodiment, a plurality of detectors, which can include any of detectors 425, 435, and 440 are arranged in various locations of a surface of condensate pan 134. In one embodiment, these detectors can be arranged into rows, such as first row 505, second row 510, and third row 515. It is appreciated that any of detectors 425, 435, or 440 can be arranged in various configurations such that at least one detector is associated with a point of condensate pan 134 that is capable of submersion below liquid surface 420.

Generator 410 is generally configured to propagate light beam 415 into condensate pan 134. In one embodiment and as illustrated in FIG. 5, light beam 415 can be propagated so that it is coplanar or substantially coplanar with first row 505. In various embodiments, light beam 415 can be coplanar with any plane that includes any two of detectors 425, 435, or 440. When, for example, light beam 415 passes liquid surface 420 it can refract. Potential paths for refracted light beam 430 are illustrated as broken lines in FIG. 5. In one embodiment, refracted light beam 430 can be detected by at any detector, such as second detector 435 that is associated with a location of condensate pan 134 beneath liquid surface 420.

For example generator 410 can propagate light beam 415 into condensate pan 134 towards a location associated with detector 425, which in this example is located in first row 505 that is coplanar with light beam 415. When light beam 415 passes liquid surface 420, it refracts, and refracted light beam 430 can be detected by second detector 435 that is associated with a location in condensation pan that is different from the location associated with first detector 425. In one embodiment, first detector 425 and second detector 435 can both be located in first row 505 that can be coplanar with at least one of light beam 415 and refracted light beam 430. In another embodiment, refracted light beam 430 can illuminate a location within condensate pan 134 that is associated with a second detector 435 that can be in a different row than that of first detector 425, such as second row 510 or third row 515, for example. In an embodiment where first detector 425 and second detector 435 are both located in the same row, such as first row 505, then the plane along which both light beam 415 and refracted light beam 430 travel can be generally coplanar with first row 505. In one embodiment, light beam 415, refracted light beam 430, first detector 425, second detector 435, and first row 505 can all be coplanar. In another embodiment where first detector 425 and second detector 435 can be in different rows, such as when first detector 425 is included in first row 505 and where second detector 435 is included in second row 510 or third row 515, for example. In this illustrative embodiment light beam 415 was directed towards a location in condensation pan 134 associated with first row 505 and first detector 425, but refracted light beam 430 illuminates a different location in condensation pan 134 that is associated with, for example, a detector 435 and second row 510. In this illustrative embodiment refracted light beam 430 and light beam 415 travel through different planes, i.e., they are not coplanar. This may occur, for example, when liquid in condensate pan 134 includes debris, or where condensate pan 134 is tilted, not level, subject to motion, or irregularly shaped.

Figure 6:
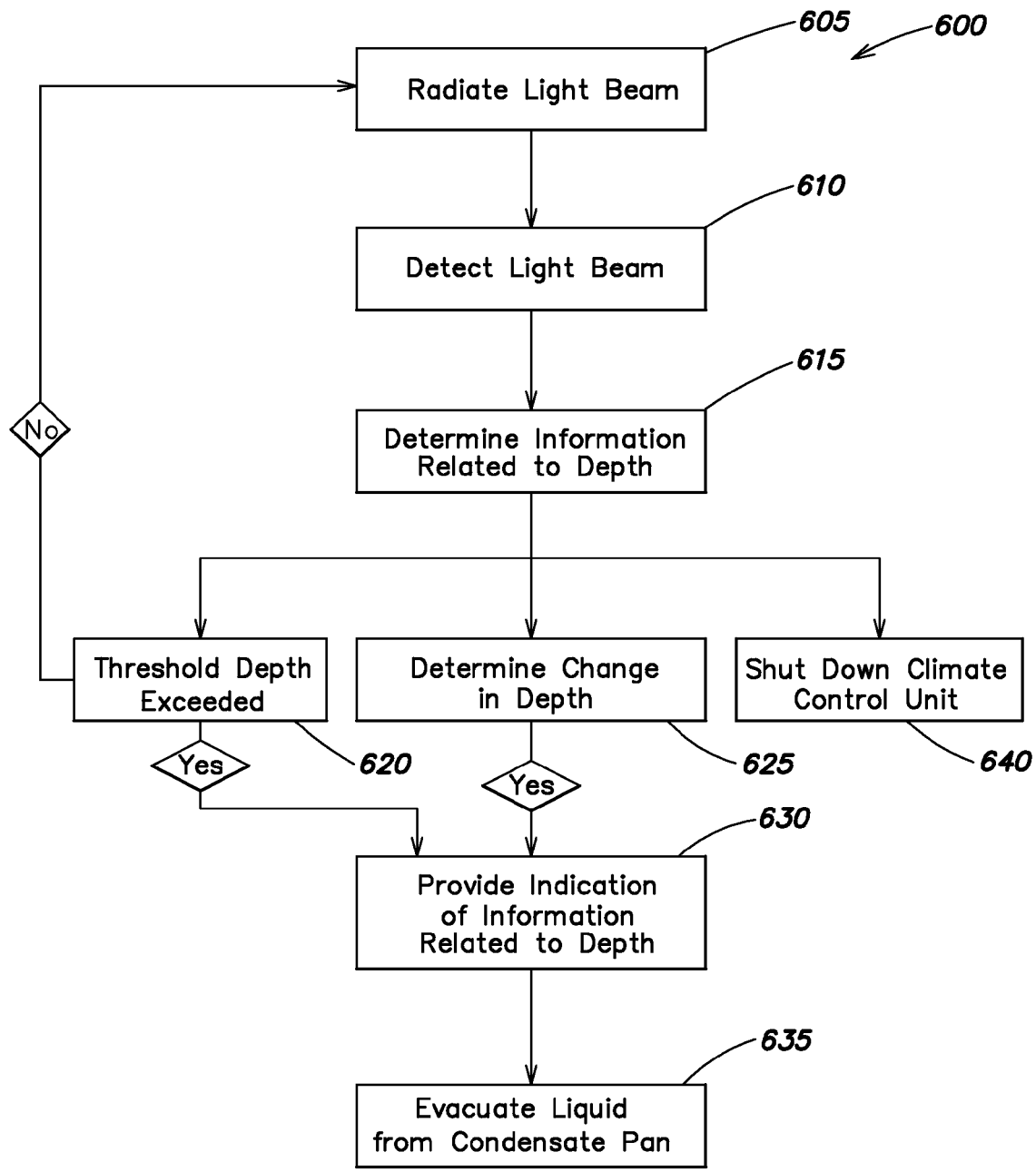
FIG. 6 is a flow chart illustrating a method of detecting fluid depth in accordance with an embodiment of the invention.

Turning to FIG. 6, there is shown a flow chart depicting a method 600 of detecting liquid depth in a condensate pan of a climate control unit. In one embodiment method 600 includes the act of radiating a light beam into a liquid contained in a condensate pan associated with the climate control unit (ACT 605). In one embodiment this radiating act, (ACT 605) can include emitting a laser beam. Generally radiating a light beam (ACT 605) includes propagating, radiating, directing, or emitting a light beam from a beam generating device towards a condensate pan associated with a climate control unit. In an embodiment radiating a light beam (ACT 605) includes radiating a light beam into a liquid that is contained in a condensate pan associated with a climate control unit. For example, the light beam can be radiated (ACT 605) towards a first point that is below a surface of a liquid that has collected in the condensate pan during operation of the climate control unit.

In one embodiment the liquid can include liquid that condenses on cooling coils of a climate control unit, and then drips or flows into the condensate pan, where it collects. In this example, radiating a light beam (ACT 605) can include radiating a light beam into the liquid. The light beam may be directed towards a point in the condensate pan located below the surface of a liquid. This point can include a point that the light beam will illuminate in the absence of any liquid in the condensate pan. In this illustrative embodiment, radiating a light beam (ACT 605) into a liquid that is contained in a condensate pan and towards a first point below the surface of the liquid includes radiating the light beam so that, but for the existence of the liquid, the light beam would illuminate or radiate upon the first point towards which it is directed.

In one illustrative embodiment, radiating the light beam (ACT 605) includes radiating the light beam towards a particular location in a condensate pan such that if there is no fluid in the condensate pan the light beam will strike that known location. Continuing with this example, the known location can be submerged as liquid from a climate control unit collects in the condensate pan. In this embodiment, where liquid sufficient to submerge the known location is present, all or part of a light beam radiated (ACT 605) into the condensate pan may be refracted away from the known location towards which it was directed due to the presence of the liquid.

Method 600 next includes the act of detecting the light beam at a second point below the surface of the liquid (ACT 610). In one embodiment detecting the light beam (ACT 610) includes detecting the light beam by one of a series of positive intrinsic negative (PIN) diodes. In various embodiments other light emitting diode, photodiode, or photodetector devices can be used as previously described. In one illustrative embodiment, a liquid such as water can collect in the condensate pan so that the first point in the condensate pan, (i.e., the point to which the light beam is directed) is submerged. In this illustrative embodiment, the light beam, once radiated (ACT 605) penetrates beneath the surface of the liquid in the condensate pan. Generally, the presence of the liquid causes the light beam to bend, or refract, so that it no longer strikes the first point in the condensate pan towards which it was directed. Instead, in this illustrative embodiment, the light beam at least in part strikes a second point in the condensate pan where the light beam may be detected (ACT 610). In one embodiment the light beam is detected (ACT 610) by a device such as a PIN diode at a second point in the condensate pan that is below the surface of the liquid. Typically, the second point in the condensate pan has a different location in the condensate pan than the first point in the condensate pan.

In various embodiments, the level, viscosity, type, color, level of contamination, depth or volume of a liquid into which the light beam is radiated can cause the radiated light beam to refract as it is radiated, first through air and then through another medium such as liquid. In this embodiment the light beam may not illuminate the first point below the surface of the liquid. Instead, in this example, the light beam due to this refraction may illuminate a second point below the surface of the liquid. In one embodiment refraction of the light beam as it passes through the liquid can cause the light beam to illuminate the first point with less intensity than it would otherwise illuminate the first point if no liquid were present. In one embodiment detecting the light beam (ACT 610) can include detecting at least a portion of the light beam at a second point below the surface of the liquid that is different than the first point below the surface of the liquid, where the first point includes the point towards which the light beam was radiated in radiating act (ACT 605.)

Method 600 can further include the act of determining information related to a depth of the liquid based in part on the detected light beam (ACT 615). In one embodiment determining information related to liquid depth (ACT 615) includes determining a measurement of an actual depth, in millimeters, centimeters, or inches. In one embodiment this depth can be determined based on a calculation involving the distance between the first point, (i.e. the point that the light beam was radiated toward (ACT 605)) and the second point (i.e., the point where the light beam was detected (ACT 610)).

Figure 7:
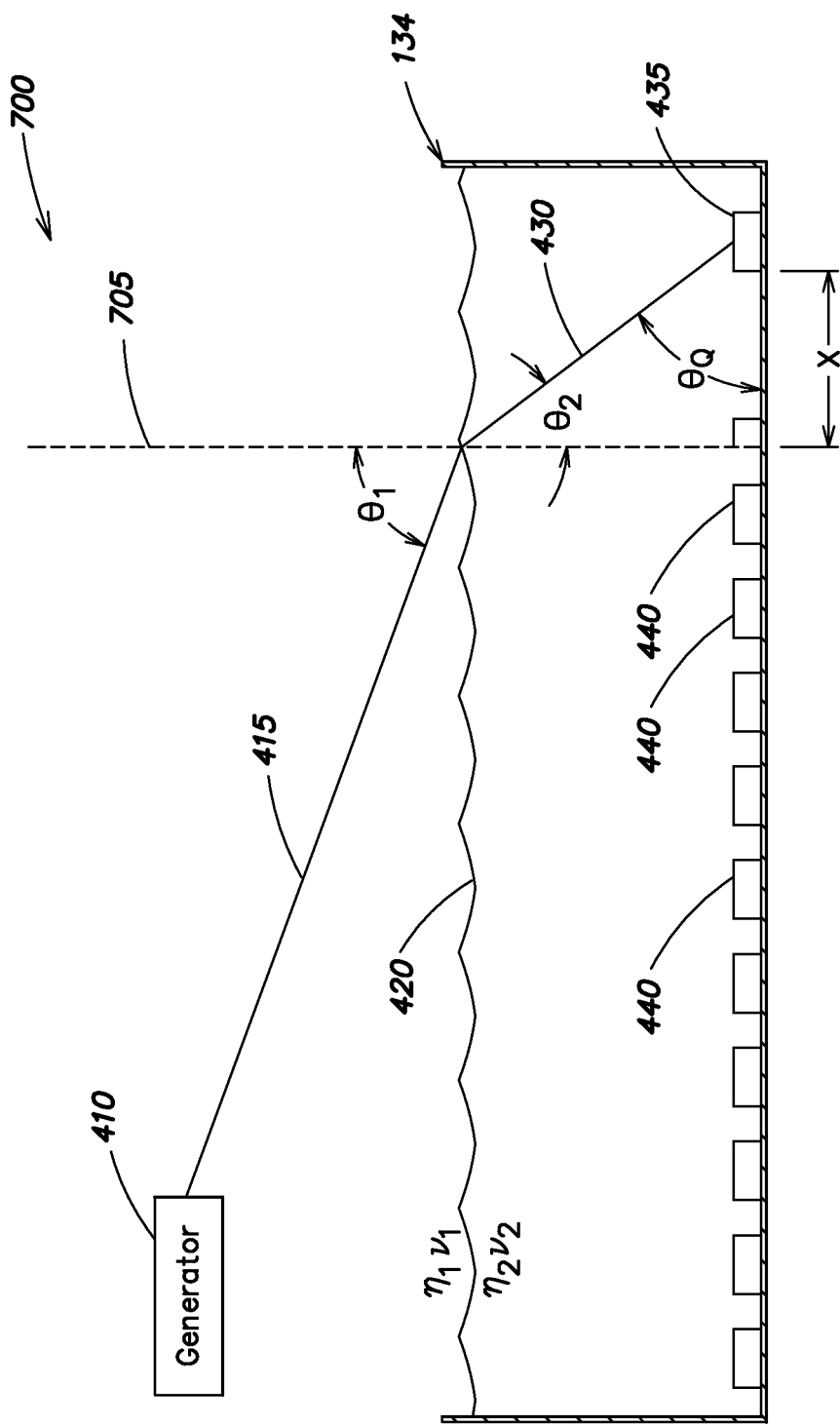
FIG. 7 is a diagram of the refraction of a light beam as it passes through a liquid surface in accordance with an embodiment of the invention.

For example, in the embodiment illustrated by FIG. 7, light beam 415 passes through one medium, such as air, into another medium, such as water or another liquid. In this illustrative embodiment, these two media (e.g., air and water) have different refractive indices, where water refractive index $n_2$ is greater than air refractive index $n_1$, and different velocities, where water light beam velocity $v_2$ is less than air light beam velocity $v_1$. As is illustrated in exemplary FIG. 7, the angle of refraction $\theta_2$ is greater than the angle of incidence $\theta_1$, such that refracted light beam 430 is closer to normal line 705. With reference to equations (1-3) below, the ratio of the sine of the angle of incidence $\theta_1$ to the sine of the angle of refraction $\theta_2$ is equal to the ratio of velocities $v_l$ to $v_2$ and is also equal to the inverse ratio of indices of refraction $n_2$ to $n_1$.

$$\frac{Sin\theta_1}{Sin\theta_2} = \frac{v_1}{v_2} = \frac{n_2}{n_1} \quad (1)$$

$$n_1 Sin\theta_1 = n_2 Sin\theta_2 \quad (2)$$

$$Sin\theta_2 = \frac{n_1 Sin\theta_1}{n_2} \quad (3)$$

For example, let $\theta_1=45°$, $n_1=1.00029$, and $n_2=1.33$. (In this example the refractive index n of a vacuum is 1.00000.) Using these exemplary numbers with equation (3) to solve for $\theta_2$, it can be seen that $\theta_2=32.128062°$. As a result, at the interface between the air and liquid mediums (i.e., liquid surface 420), the angle of refraction is 32.18062°, and as a result angle $\theta_Q$ at the bottom of condensate pan 134 is in this example 57.871938°. It should be appreciated that the angle of normal line 705 with respect to the bottom of condensate pan 134 is in this example 90°.

Continuing with this example, detector 435, which is at least in part illuminated by refracted light beam 430, may be of a certain distance X from the point at which normal line 705 intersects with the bottom of condensate pan 134. For example, this distance X may be determined to be 5" where there are a plurality of detectors lined up one 1" apart from each other in a row on the bottom of condensate pan 134, beginning at the point at which normal line 705 intersects the bottom of condensate pan 134. In this example, the fifth detector from that point of intersection (i.e., the detector illuminated by light beam 430 in this example) would be 5" away from that point, (i.e., X=5".) At this point, the liquid depth may be determined by equation (4).

$$LiquidDepth = \frac{X}{Tan\theta_2} \quad (4)$$

Continuing with this example, where X=5", and $\theta_2=32.18062°$, the liquid depth in condensate pan 134 is 7.962". In various embodiments, this depth can be compared against a threshold value to determine if liquid is to be evacuated from condensate pan 134. In at least one embodiment this liquid depth, related information, or both may be displayed, trigger alarms, or otherwise processed, for example by controller 90a, to control the liquid depth level. In one embodiment this liquid depth information may processed by controller 90a to change a mode of operation of cooling unit 50 to, for example, prevent the accumulation of further liquid in condensate pan 134 until after at least some liquid has been evacuated from condensate pan 134. It should be appreciated that in various embodiments, the angles, indices, dimensions, and distances, X, $n_1$, $n_2$, $v_1$, $v_2$, $\theta_1$, $\theta_2$, $\theta_Q$, and normal line 705 may all vary, and that the numbers used in the above described example are illustrative and non-limiting.

Returning to FIG. 6, in another embodiment determining information related to liquid depth (ACT 615) includes determining if the depth or volume of liquid in the condensate pan is increasing, decreasing, or remaining unchanged over a time period. In various embodiments determining information related to liquid depth (ACT 615) also includes determining information related to liquid depth at more than one point within the condensate pan. This may include, for example, determining liquid depth at one point of a condensate pan relative to liquid depth at another point of the condensate pan at either the same or a different time instance. In another embodiment determining information related to liquid depth (ACT 615) can include determining additional information such as a type, viscosity, color, or contamination of the liquid.

Determining information related to liquid depth (ACT 615) may also include the act of determining that the depth of the liquid is greater than a threshold depth (ACT 620). In one embodiment, detection of the light beam (ACT 610) at a point of the condensate pan is sufficient to indicate that a threshold liquid depth in the condensate pan has been met or exceeded. For example, a threshold liquid depth or volume may be a depth or volume that causes refraction of the light beam to an identified point below the surface of the liquid. Detection of the light beam (ACT 610) at this identified point may then indicate that the threshold depth of liquid in the condensate pan has been met or exceeded (ACT 620). A threshold depth generally includes, for example, a depth or volume of liquid in the condensate pan above which it may be desirable to cease the function of the climate control unit, or to evacuate the liquid from the condensate pan manually or by use of a pump, drain, or other plumbing.

Method 600 may also include the act of determining a change in liquid depth with time (ACT 625). This determining act (ACT 625) may include determining information related to the depth of a liquid at a first time, and again at a second time. Any difference, such as an increase or decrease in the depth at one time relative to another, may then be determined. Determining a change in liquid depth (ACT 625) may, but need not include an actual depth measurement. For example, determining a change in liquid depth (ACT 625) may include a determination that the liquid depth has increased relative to its depth at a previous time, without a measurement of the depth being taken or determined. In one embodiment, determining a change in liquid depth (ACT 625) can include determining a change in information related to a depth of the liquid.

In various embodiments method 600 includes the act of providing an indication of information related to the depth of the liquid (ACT 630). For example, if it is determined that liquid depth is greater than a threshold value (ACT 620), or if a change in liquid depth is determined (ACT 625), method 600 may proceed by providing an indication of information related to the liquid depth (ACT 630). In one embodiment providing an indication (ACT 630) can include a display including a series of Positive Intrinsic Negative (PIN) diodes, although generally any light emitting, photodetector, or photodiode devices can be used. Providing an indication of information related to liquid depth (ACT 630) may include a graphical user interface such as a monitor that can be electrically coupled to detectors that perform the act of detecting the light beam (ACT 610).

In another embodiment, the detectors themselves, which may include PIN diodes or photodiodes that activate (i.e., emit light) when struck by a light beam can perform the act of providing an indication of information related to liquid depth (ACT 630) by activating in their location under the surface of the liquid. In this illustrative embodiment the detectors including photodiodes can be arranged under the surface of the liquid so that they are visible to a person such as a maintenance technician or user who visually inspects the climate control unit. For example, illumination of a photodetector associated with a particular location of a condensate pan can be sufficient to indicate that water depth has reached a certain level, such as a threshold level, or other information related to liquid depth. In one embodiment a particular detector including a photodetector may be of a different color than photodetectors associated with other diodes, and activation of that particular photodetector, caused by a light beam hitting that particular detector, indicates that liquid depth has reached a level sufficient to refract the beam of light to a position where it is sensed by that particular detector. In an alternate embodiment, detectors associated with the condensate pan can be located under the surface of the liquid, with a Light Emitting Diode (LED) or other type of display located remotely, (i.e., not inside or in direct contact with the condensate pan.)

In some embodiments, such as when it is determined that a threshold depth has been met or exceeded (ACT 620) or where an increase in depth is determined (ACT 625), method 600 may proceed with the act of evacuating the liquid from the condensate pan (ACT 635). Evacuating the liquid from the condensate pan may include draining the liquid from the condensate pan. For example a drain may be manually opened, or may exist at a certain level of the condensate pan so that water reaching that level will exit the condensate pan due to gravitational forces. In one embodiment a controller associated with the climate control unit can direct a drain to open by, for example, actuating a mechanical stopper from a position where it covers the drain to a position where it does not. In another embodiment evacuating liquid from the condensate pan (ACT 635) includes activating a pump. It is appreciated that in various embodiments evacuating the liquid from the condensate pan (ACT 635) can include manually moving the condensate pan from its location associated with the climate control unit, (such as from under the cooling coils, for example) to another location where liquid that has collected in the condensate pan can be safely disposed of.

Method 600 may also include the act of shutting down the climate control unit (ACT 640). Typically, shutting down the climate control unit (ACT 640) includes ceasing the cooling operations of the climate control unit. This generally prevents further condensation from forming on the cooling coils, which stops the flow of liquid into the condensate pan. Shutting down the climate control unit (ACT 640) may be reversible. For example, after shutting down the climate control unit (ACT 640), the condensate pan can be at least partially emptied and the climate control unit can then resume operation to control atmospheric conditions around the climate control unit. Shutting down the climate control unit (ACT 640) in one embodiment includes disrupting input power to the climate control unit.

Note that in FIGS. 1 through 7, the enumerated items are shown as individual elements. In actual implementations of the systems and methods described herein, however, they may include inseparable components of other electronic devices such as a digital computer. Thus, actions described above may be implemented at least in part in software that may be embodied in an article of manufacture that includes a program storage medium. The program storage medium includes data signals embodied in one or more of a carrier wave, a computer disk (magnetic, or optical (e.g., CD or DVD, or both), non-volatile memory, tape, a system memory, and a computer hard drive.

From the foregoing, it will be appreciated that the systems and methods provided herein afford a simple and effective way to determine information related to liquid depth in a condensate pan of a climate control unit. The systems and methods according to various embodiments are able to determine or display information related to at least liquid depth, liquid volume, and power consumption. This information may include increases, decreases, or rate of change of any of these characteristics with time. This increases efficiency of climate control unit operation, and lowers cost.

Any references to front and back, left and right, top and bottom, and upper and lower are intended for convenience of description, not to limit the present systems and methods or their components to any one positional or spatial orientation.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements.

Any embodiment disclosed herein may be combined with any other embodiment, and references such as "an embodiment", "some embodiments", "an alternate embodiment", "various embodiments", or the like are not necessarily mutually exclusive and are intended to indicate that a particular feature, structure, or characteristic described in connection with the embodiment may be included in at least one embodiment. The appearances of such terms herein are not necessarily all referring to the same embodiment. Any embodiment may be combined with any other embodiment in any manner consistent with the objects, aims, and needs disclosed herein.

References to "or" may be construed as inclusive so that any terms described using "or" may indicate any of a single, more than one, and all of the described terms.

Where technical features mentioned in any claim are followed by reference signs, the reference signs have been included for the sole purpose of increasing the intelligibility of the claims and accordingly, neither the reference signs nor their absence have any limiting effect on the scope of any claim elements.

One skilled in the art will realize the systems and methods described herein may be embodied in other specific forms without departing from the spirit or essential characteristics thereof. For example, the climate control unit including cooling unit 50 may include or be a component of one or more computer room air conditioner ("CRAC") units that are typically hard piped, immobile units positioned around the periphery of a data center room. Vessels other than a condensate pan may also be used in the systems and methods disclosed herein. For example, fuel tanks, storage containers, or any other vessel capable of containing liquid may be included in addition to or in place of a condensate pan. The foregoing embodiments are therefore to be considered in all respects illustrative rather than limiting of the described systems and methods. Scope of the systems and methods described herein is thus indicated by the appended claims, rather than the foregoing description, and all changes that come within the meaning and range of equivalency of the claims are therefore intended to be embraced therein.

What is claimed is:

1. A method for determining information related to liquid depth in a condensate pan of a climate control unit-comprising:
    radiating a light beam into a liquid contained in the condensate pan of the climate control unit, the light beam radiated towards a first point below a surface of the liquid;
    detecting the light beam by a first detector at a second point below the surface of the liquid;
    activating the first detector in response to detecting the light beam and emitting a first light from the first detector; and
    determining information related to a depth of the liquid based in part on the first light.

2. The method of claim 1, comprising:
    determining that the depth of the liquid is greater than a threshold depth; and providing an indication that the depth of the liquid exceeds the threshold depth.

3. The method of claim 2, comprising:
shutting down the climate control unit when the depth of the liquid exceeds the threshold depth.

4. The method of claim 3, comprising:
removing the liquid from the condensate pan.

5. The method of claim 1 wherein radiating a light beam includes radiating a laser beam.

6. The method of claim 1, comprising:
radiating the light beam at a predetermined angle with respect to the surface of the liquid.

7. The method of claim 1, comprising:
detecting, via a detector included in a first row of detectors, wherein the first row of detectors is coplanar with the light beam.

8. The method of claim 1, comprising:
determining information related to the depth of the liquid at a first time and a second time; and
providing a visual indication that the depth at the second time is greater than the depth at the first time.

9. The method of claim 1, comprising:
determining the depth of the liquid at a first time and a second time; and
providing an indication that the depth at the second time is less than or equal to the depth at the first time.

10. The method of claim 1, wherein radiating the light beam, detecting the light beam, and determining information related to the depth of the liquid are controlled by a processor, and wherein the method is implemented at least in part in a program stored in a computer readable medium and executed by the processor.

11. The method of claim 1, comprising:
activating a second detector in response to detecting the light beam and emitting a second light; and
determining information related to the depth of the liquid based in part on the second light.

12. The method of claim 11, comprising:
deactivating the first detector in response to detecting the absence of the light beam, wherein deactivating includes continuing to emit the first light for a period of time; and
determining information related to the depth of the liquid based in part on the first light and the second light.

13. The method of claim 1, wherein detecting includes using at least one of a positive intrinsic (PIN) diode, and a photodiode to detect the light beam.

\* \* \* \* \*